US010840906B2

(12) United States Patent
Rahman et al.

(10) Patent No.: US 10,840,906 B2
(45) Date of Patent: Nov. 17, 2020

(54) CROSS-TALK COMPUTING FOUNDATION FOR DIGITAL LOGIC

(71) Applicant: Curators of the University of Missouri, Columbia, MO (US)

(72) Inventors: Mostafizur Rahman, Lees Summit, MO (US); Naveen Kumar Macha, Kansas City, MO (US)

(*) Notice: Subject to any disclaimer, the term of this patent is extended or adjusted under 35 U.S.C. 154(b) by 0 days.

(21) Appl. No.: 16/412,950

(22) Filed: May 15, 2019

(65) Prior Publication Data

US 2019/0356315 A1 Nov. 21, 2019

Related U.S. Application Data

(60) Provisional application No. 62/671,603, filed on May 15, 2018.

(51) Int. Cl.
*H03K 19/003* (2006.01)
*H01L 23/528* (2006.01)
*H01L 27/06* (2006.01)
*G06F 17/10* (2006.01)
*H03K 19/20* (2006.01)

(52) U.S. Cl.
CPC ..... *H03K 19/00361* (2013.01); *H01L 23/528* (2013.01); *H01L 27/0635* (2013.01); *G06F 17/10* (2013.01); *H03K 19/20* (2013.01)

(58) Field of Classification Search
None
See application file for complete search history.

(56) References Cited

U.S. PATENT DOCUMENTS

| 6,499,131 B1* | 12/2002 | Savithri | G06F 17/5036 716/115 |
| 7,562,323 B1* | 7/2009 | Bai | G06F 17/5031 703/2 |
| 8,890,564 B2* | 11/2014 | Harker | G06F 17/5036 326/21 |
| 9,201,108 B2* | 12/2015 | Yun | G01R 27/28 |
| 2010/0246152 A1* | 9/2010 | Lin | H01L 21/563 361/783 |

* cited by examiner

*Primary Examiner* — Amy Cohen Johnson
*Assistant Examiner* — James H Cho
(74) *Attorney, Agent, or Firm* — C. John Brannon; Brannon Sowers & Cracraft PC

(57) ABSTRACT

The presently disclosed invention astutely turns the potentially detrimental crosstalk effect in nanocircuitry into an advantage by engineering interference among single lines. In one embodiment, a nanocircuit logic gate within an array of nanocircuitry comprises first and second aggressor metal conductive lines; a victim line; and an inverter coupled to the victim line; wherein the first and second aggressor conductive lines are positioned to induce a signal on the victim line. In another embodiment, a nanocircuit logic gate within an array of nanocircuitry comprises first and second aggressor metal conductive lines; a control aggressor metal conductive line; a victim line; and a first inverter coupled to the victim line; wherein the first and second aggressor conductive lines and the control aggressor conductive line are positioned to induce a signal on the victim line. Further embodiments include complex computational and logic structures based on these efficient logic circuits.

20 Claims, 14 Drawing Sheets

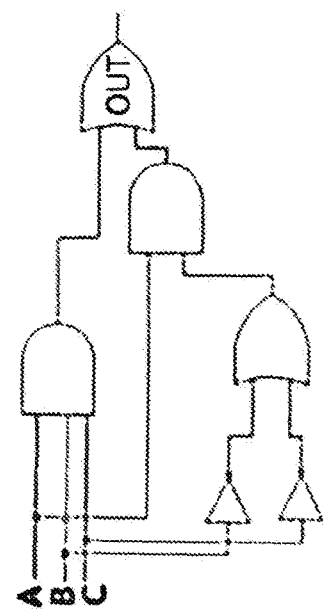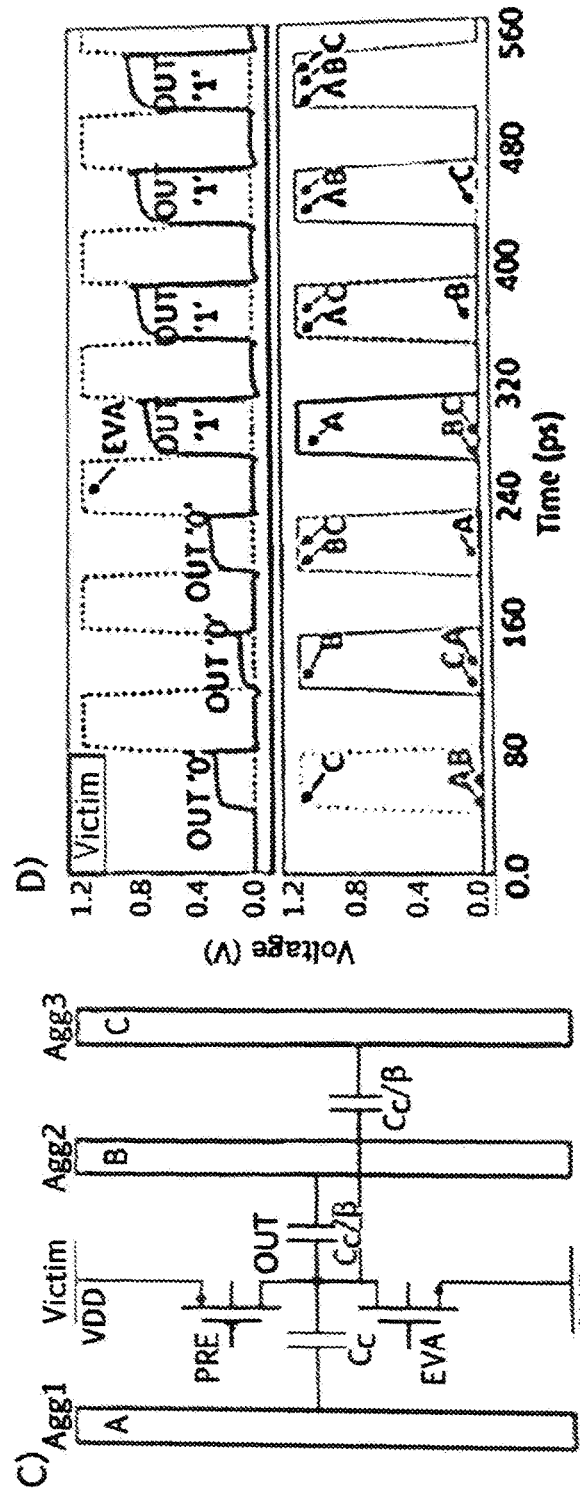
FIG. 4A-4D

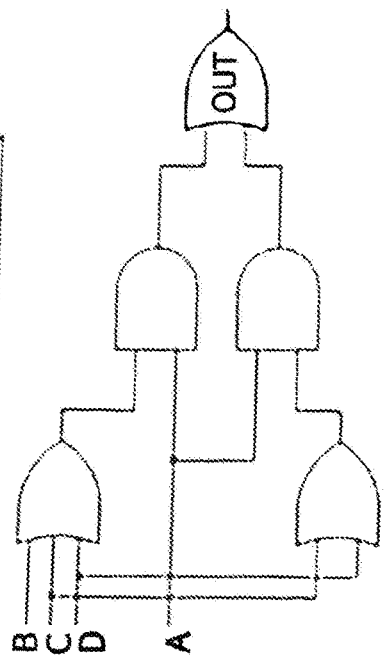
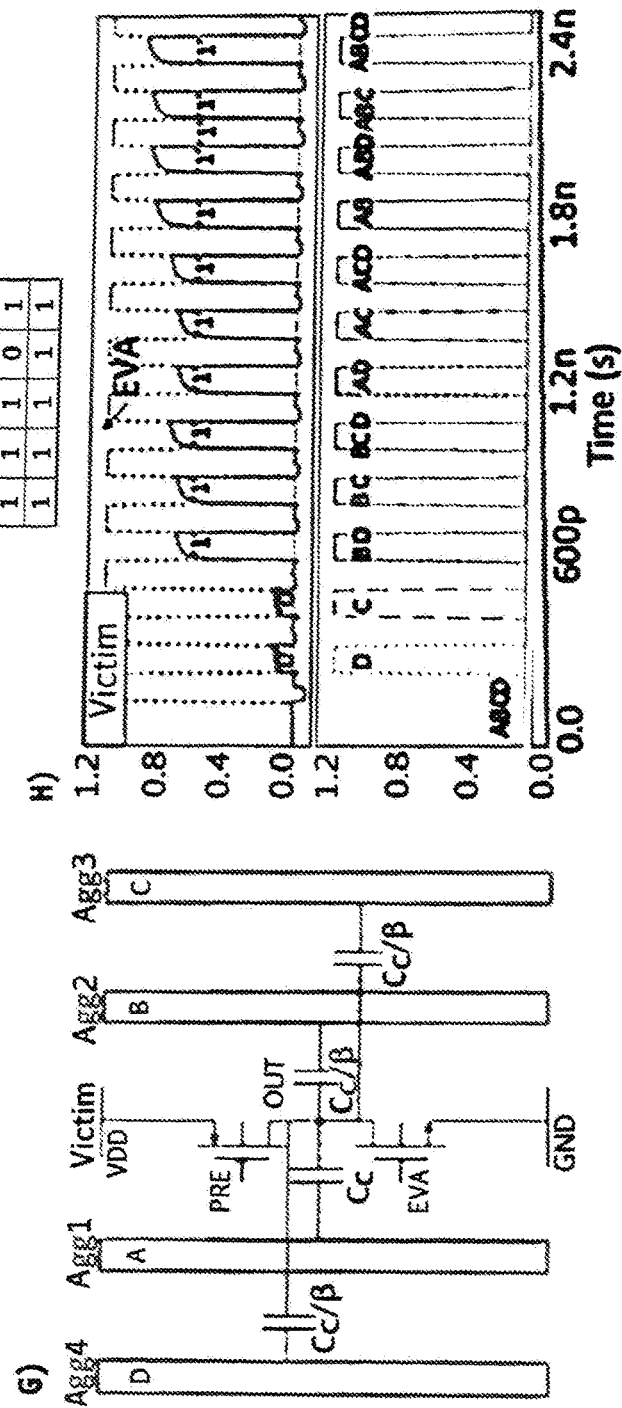
FIG. 4E-4H

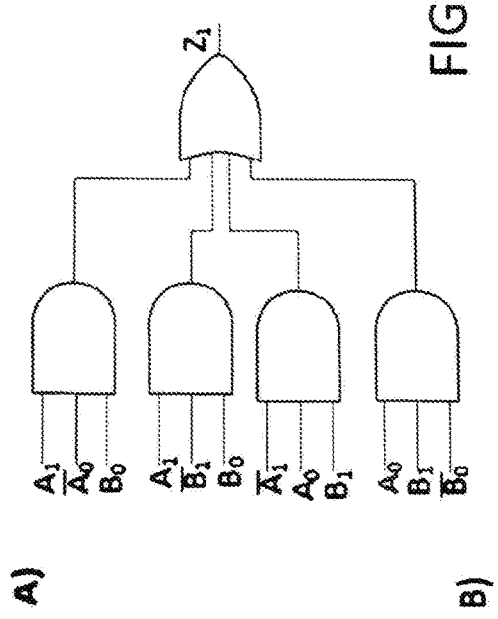
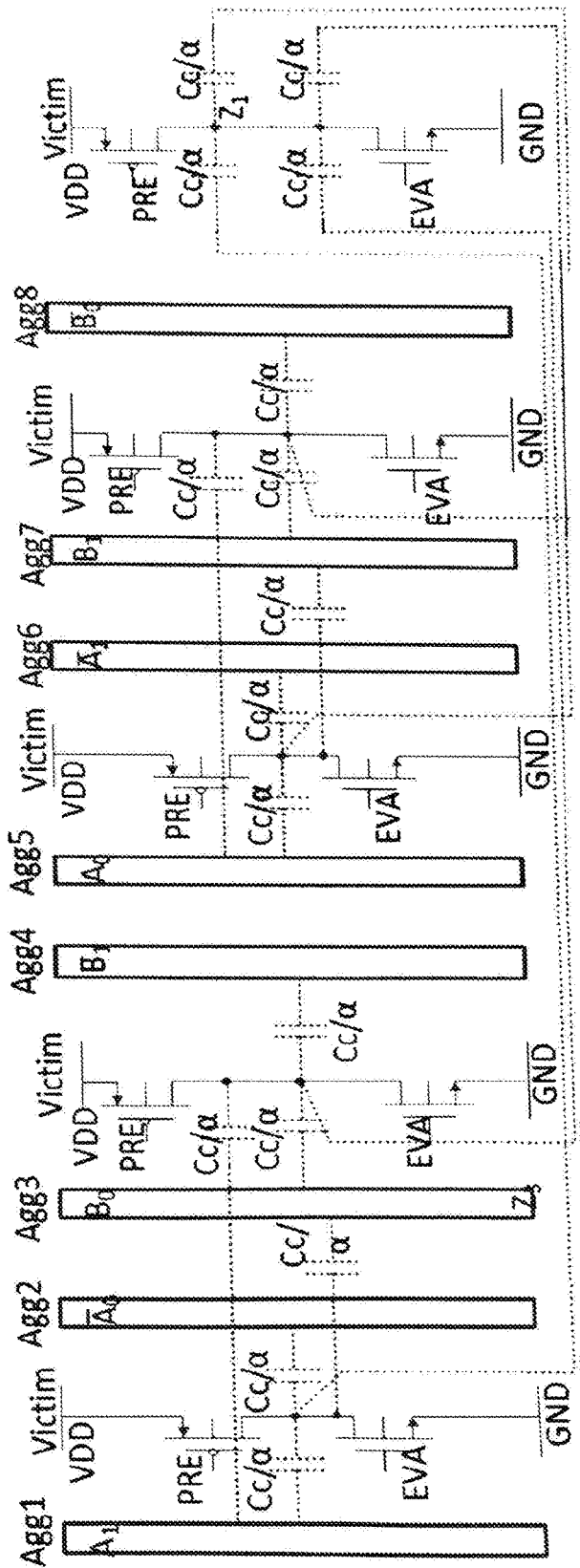
FIG. 6A
FIG. 6B

FIG. 7

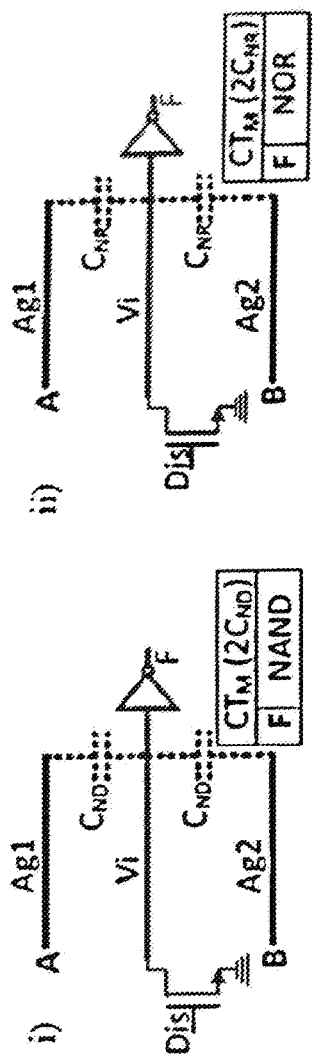
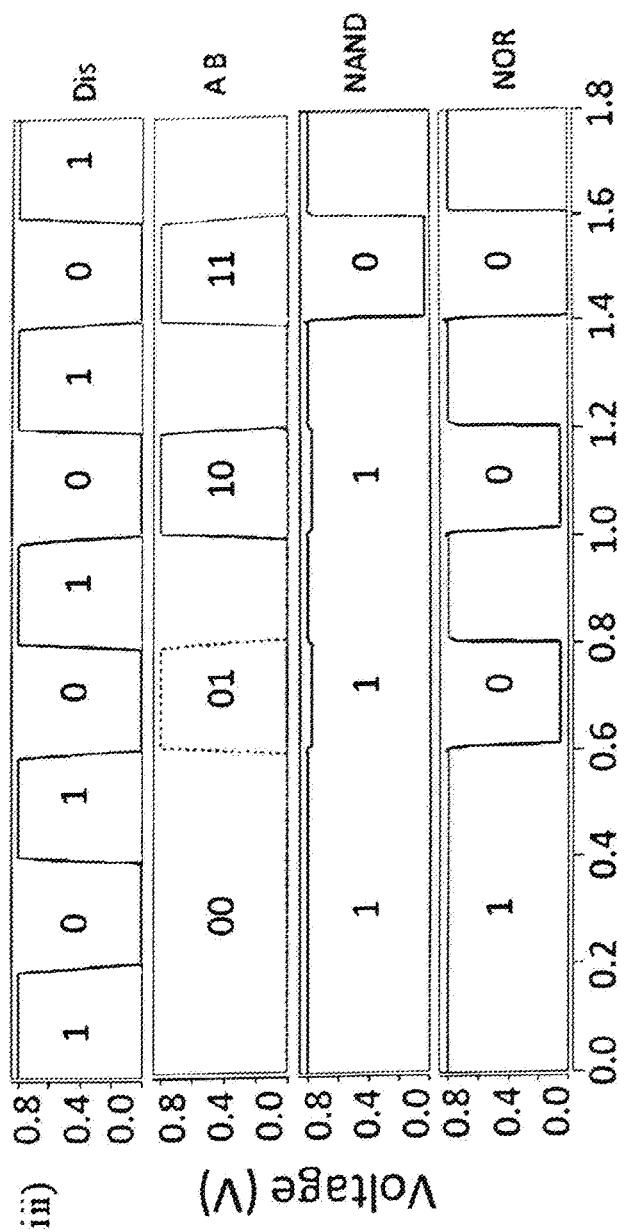
FIG. 10A
FIG. 10B
FIG. 10C

| POLYMORPHIC CELLS | COMPLEX FUNCTIONS | Transistor Count | | Power (μW) | |
|---|---|---|---|---|---|
| | | CMOS | Crosstalk | CMOS | Crosstalk |
| NAND2/NOR2 | A'+B'+A'B'C | 14 | 3 | 6.3259 | 2.6175 |
| AND2/OR2 | AB+C(A+B) | 16 | 5 | 7.7344 | 3.2789 |
| NAND3/NOR3 | A'+B'+C'+A'B'C'D | 20 | 3 | 5.1617 | 2.8212 |
| AND3/OR3 | ABC+AD+BD+CD | 22 | 5 | 6.5702 | 3.6271 |
| OAI21/AOI21 | A'B'+C'+A'D+B'D+DC' | 18 | 3 | 4.8483 | 3.9291 |
| OA21/AO21 | AC+BC+DC+ABD | 20 | 5 | 5.5694 | 4.5995 |
| NAND3/OAI21 | A'+B'+C'+DC'+A'B'D | 20 | 3 | 7.0964 | 3.7953 |
| AND3/OA21 | ABC+ADC+DBC | 22 | 5 | 7.8469 | 4.288 |
| NAND3/AOI21 | A'+B'+C'+A'C'D+B'C'D | 20 | 3 | 6.1739 | 4.0905 |
| AND3/AO21 | ABC+ABD+DC | 22 | 5 | 7.5824 | 4.7294 |
| OAI21/NOR3 | A'B'+C'+A'B'C'D | 20 | 3 | 5.741 | 4.0243 |
| OA21/OR3 | AC+BC+AD+BD+DC | 22 | 3 | 7.1495 | 5.3114 |
| AOI21/NOR3 | A'C'+B'C'+A'B'C'D | 20 | 3 | 5.8568 | 4.6634 |
| AO21/OR3 | AB+C+AD+DB+DC | 22 | 5 | 7.8874 | 5.1526 |
| NAND2/XOR2 | A'+B'+AB'C+A'BC | 30 | 7 | 5.7315 | 3.4898 |
| AND2/XNOR2 | AB+ABC+A'B'C | 32 | 9 | 6.2133 | 4.1493 |
| XOR/NOR2 | A'B+AB'+CA'B' | 30 | 7 | 5.8224 | 3.8555 |
| XNOR/OR2 | AB+A'B'+AC+AB | 32 | 9 | 5.6799 | 4.535 |

FIG. 12

CROSS-TALK COMPUTING FOUNDATION FOR DIGITAL LOGIC

CROSS-REFERENCE TO RELATED APPLICATIONS

This patent application claims priority to U.S. provisional patent application Ser. No. 62/671,603, filed on May 15, 2018, the disclosures of which are incorporated herein by reference.

TECHNICAL FIELD

The present novel technology relates generally to the field of computer engineering and, more particularly, to the implementation of crosstalk in control circuit design.

BACKGROUND

As scaling of technology nodes go below 10 nm scale, hard and soft errors due to process imprecision, variation, and aging is adversely affecting the yield and reliability of ICs. Fault tolerant circuits can help in mitigating the concerns and increase reliability. A truly fault resilient circuit scheme can also gracefully recover from run-time faults such as those that incur due to radiation, high-power microwave, and cyber threats. Traditional approach for fault tolerance has been concentrated on redundancy based circuits such as CMOS circuit multiplexing, triple modular redundancy, and its generalized extension N-tuple modular redundancy, triplicated interwoven redundancy and its generalized extension N-tuple interwoven redundancy, and quidded logic. The need for duplication of logic in these schemes results in large overhead. A more recent approach for fault tolerance looks at circuit level reconfigurability/polymorphism to achieve multiple functionalities with a single logic block. When a single gate becomes malfunctional, another working gate (the NAND in this example) can be used to perform both functionalities. The gate level reconfigurability concept can be extended to module and system level. Although, such polymorphic concepts are enabling, a scalable CMOS alternative paradigm to achieve this is lacking. Existing approaches either rely on environmental control variables such as light, temperature, or require new exotic switches that are yet to mature. Thus, there remains a need for an improved fault-resistant circuit scheme. The present novel technology addresses this need.

BRIEF DESCRIPTION OF THE DRAWINGS

The above-mentioned and other features and objects of this invention, and the manner of attaining them, will become more apparent and the invention itself will be better understood by reference to the following description of embodiments of the invention taken in conjunction with the accompanying drawings, wherein:

FIGS. 4A-H are drawings of further complex logic circuits including components according to embodiments of the invention.

FIG. 6A is a drawing of cascading logic circuit in CMOS and FIG. 6B is a drawing of an equivalent cascading logic circuit according to another embodiment of the invention.

FIG. 7 is a drawing of six circuits implementing 3 variable polymorphic functions according to embodiments of the present invention.

FIGS. 10A and 10B are circuit diagrams of basic NAND and NOR gates, respectively, according to embodiments of the present invention, and FIG. 10C shows a corresponding state graph of the circuitry of FIGS. 10A and 10B.

FIG. 12 is a listing of polymorphic cells usage to provide complex logic functions as well as a comparison in number of transistors and power versus CMOS.

Figure 1:
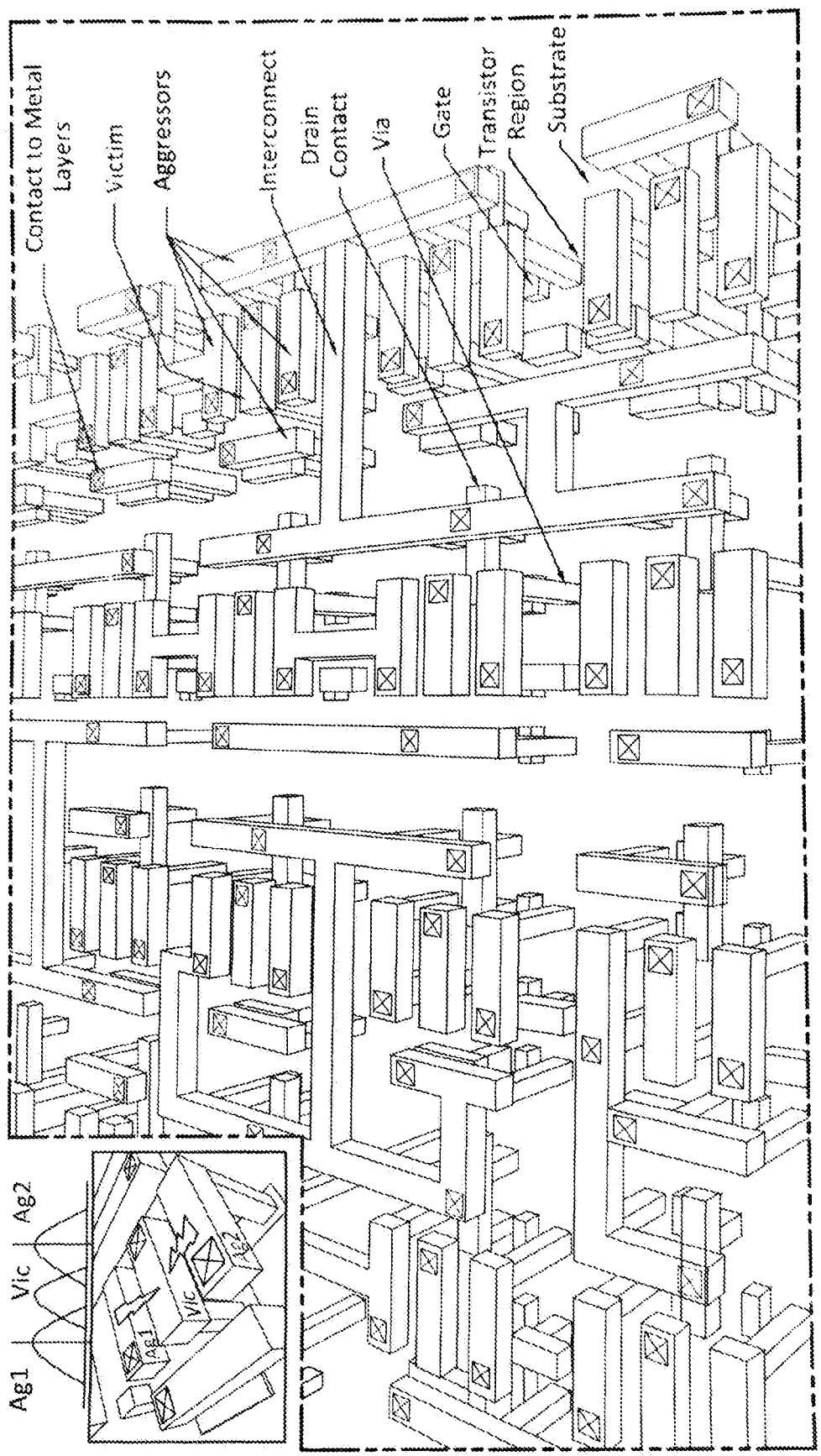
FIG. 1 is a schematic diagrammatic view of a complex nanocircuit where embodiments of the present invention may be utilized.

Corresponding reference characters indicate corresponding parts throughout the several views. Although the drawings represent embodiments of the present invention, the drawings are not necessarily to scale and certain features may be exaggerated in order to better illustrate and explain the present invention. The flow charts and screen shots are also representative in nature, and actual embodiments of the invention may include further features or steps not shown in the drawings. The exemplification set out herein illustrates an embodiment of the invention, in one form, and such exemplifications are not to be construed as limiting the scope of the invention in any manner.

DETAILED DESCRIPTION

For the purposes of promoting an understanding of the principles of the novel technology and presenting its currently understood best mode of operation, reference will now be made to the embodiments illustrated in the drawings and specific language will be used to describe the same. It will nevertheless be understood that no limitation of the scope of the novel technology is thereby intended, with such alterations and further modifications in the illustrated device and such further applications of the principles of the novel technology as illustrated therein being contemplated as would normally occur to one skilled in the art to which the novel technology relates.

In one embodiment of the present novel technology, a computing approach is taken to leverage interference between closely coupled signal carrying nano-lines, commonly called crosstalk, to do useful computation. Typically, this approach utilizes a) metal nano-lines and their logic specific arrangements to drive inputs, b) engineered coupling capacitance between these metal nano-lines and c) synchronous dock inputs and 2 transistor based scheme to control the output behavior. As shown in FIG. 1, it k seen that metal lines are typically organized in a manner to ensure increased or maximum interference. At a particular clock period, the output node (herein designated 'victim') is kept floating and inputs are transitioned from 1→0 or 0→1 in the surrounding input metal lines (herein designated 'aggressors'). As a result of transitions in aggressors, the summation of aggressor charges gets induced in the victim node through capacitive coupling. The magnitude of signal induced typically depends on the coupling capacitance value. The coupling capacitance is inversely proportional to the separation of metal lines and directly proportional to the permittivity of the dielectric and lateral area of metal lines (which is length×vertical thickness of metal lines). Tuning the coupling capacitance values using its variables provides the engineering freedom to tailor the induced summation signal to a specific logic implementation.

A two-transistor based output control scheme may be utilized to control victim's floating behavior and to ensure synchronization with rest of the circuits. In this scheme, the victim node is typically connected to the source side of a 'precharge' transistor on one end and to the drain side of a 'discharge' transistor on the other end. The precharge transistor is typically connected to VDD and gated by a 'pre' clock signal and the discharge transistor is typically connected to GND on the source side and gated by 'eva' signal. To keep the victim node floating for logic computation, either the precharge or the discharge transistor will be turned ON first using the pre or eva signals before the logic computation phase to keep the victim node floating at 1 or 0. After computation is done and the victim signal is read out, the eva signal is typically turned ON to discharge.

Figure 2:
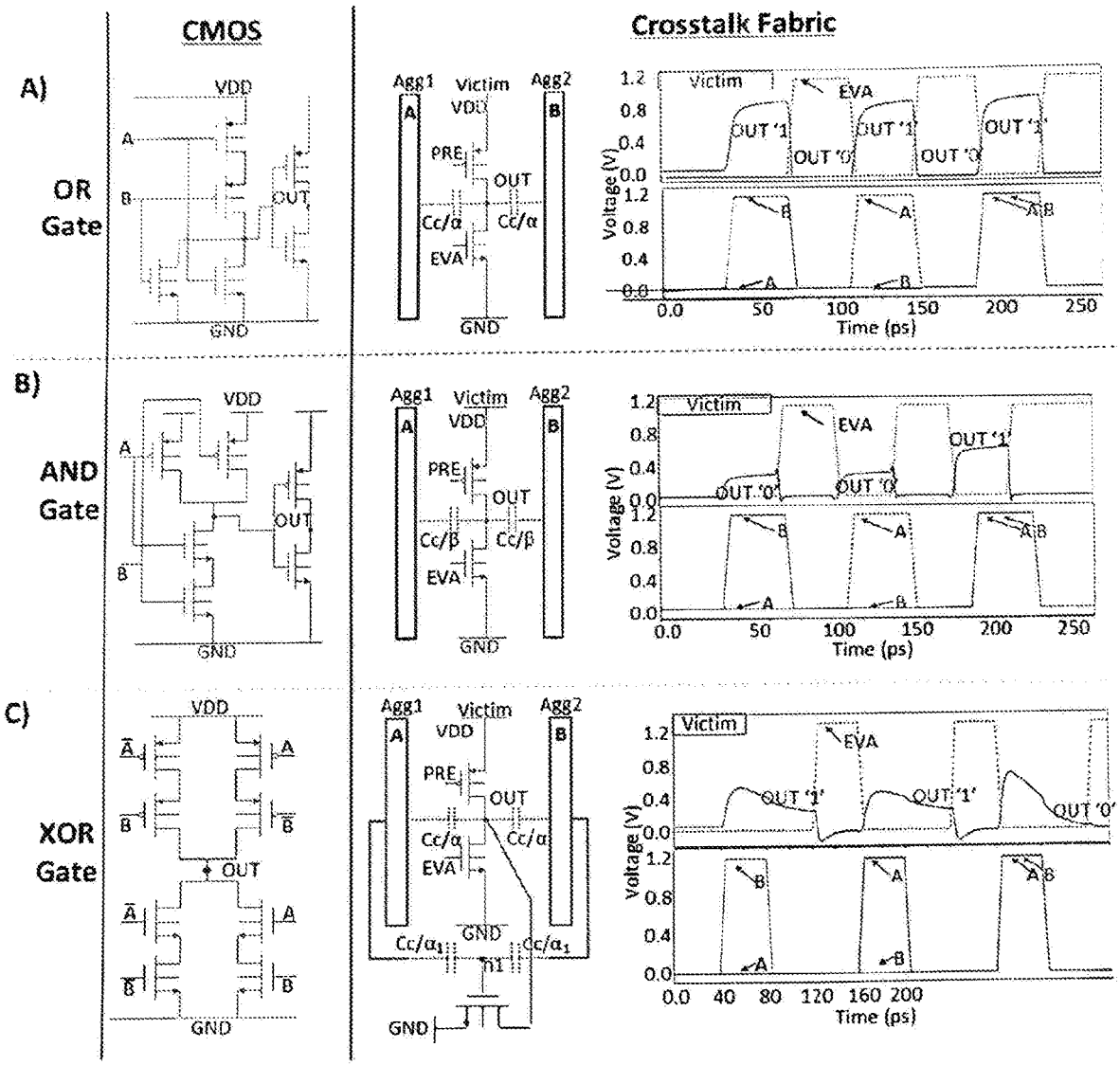
FIG. 2 is a chart diagram of CMOS and crosstalk circuits which may be utilized as logic circuitry in conjunction with embodiments of the present invention.

FIG. 2, illustrates implementation of basic gates in crosstalk fabric and CMOS. 2-input CMOS OR gate requires four transistors, with each respective transistor gated with input, and transitions when the input changes. As a result of transistor switching, the output node gets connected to static VDD/GND signal. In contrast, crosstalk computing is dynamic; the output node is kept floating by disconnecting it from VDD and GND through transistors that are switched off. When the input transitions in A and B both occur, charges are induced in the OUT node. This same principle is used for OR and AND gates (see FIG. 2) with the only difference of coupling strengths between inputs and output. For OR gate, the coupling (Cc/α) is typically stronger than AND gate's (Cc/ß) and is chosen such that whenever any of the inputs or both the inputs transition (A or B), the OUT gets coupled voltage (0 or 1). For AND, both the inputs need to transition to 1. Similarly, non-linear circuits such as XOR, XNOR may be also implemented using crosstalk. The difference between crosstalk AND/OR and XOR is the implementation of heterogeneous coupling in XOR. Here, the inputs are coupled to OUT with coupling strength CC/α and to another node n1 through CC/α1. The n1 signal gates a transistor whose Drain side is connected to OUT and whose Source side is connected to GND. As CC/α>CC/α1, for input transitions (A=1, B=0 and A=0, B=1), the OUT gets coupled value 1. When both A and B transition to 1, the n1 signal turns to 1 and the transistor is switched; as a result OUT goes to 0 as per XOR logic. Similarly, other basic gates such as NAND, NOR, and XNOR can be also implemented. As any function can be decomposed into AND, OR or NAND, NOR, it is apparent that any logic function may be implemented with crosstalk computing—hence this computing approach is functionally complete.

One advantage of crosstalk computing is its ability to perform logic compression. For example, a complex logic expression that requires a combination of AND and OR gates, which traditionally requires many transistors for implementation, may typically be implemented with just one gate and with only two transistors. The logic compression is possible by varying coupling strength between aggressors and victim, and also by having high fan-in.

EXAMPLE

Figures 3A, 3B, 3C, 3D:
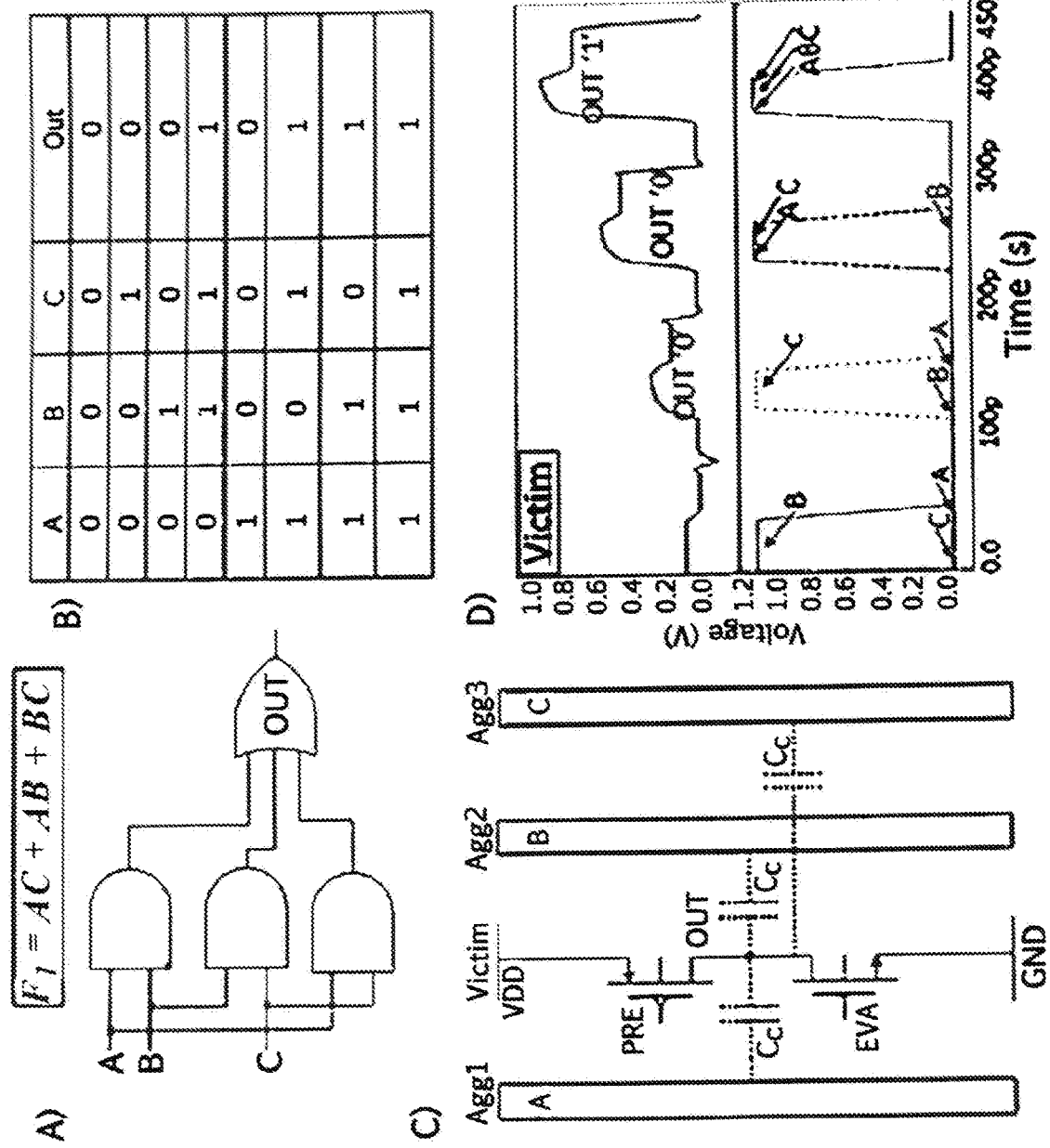
FIGS. 3A-H are drawings of complex logic circuits including components according to embodiments of the invention.
Figures 3E, 3F, 3G, 3H:
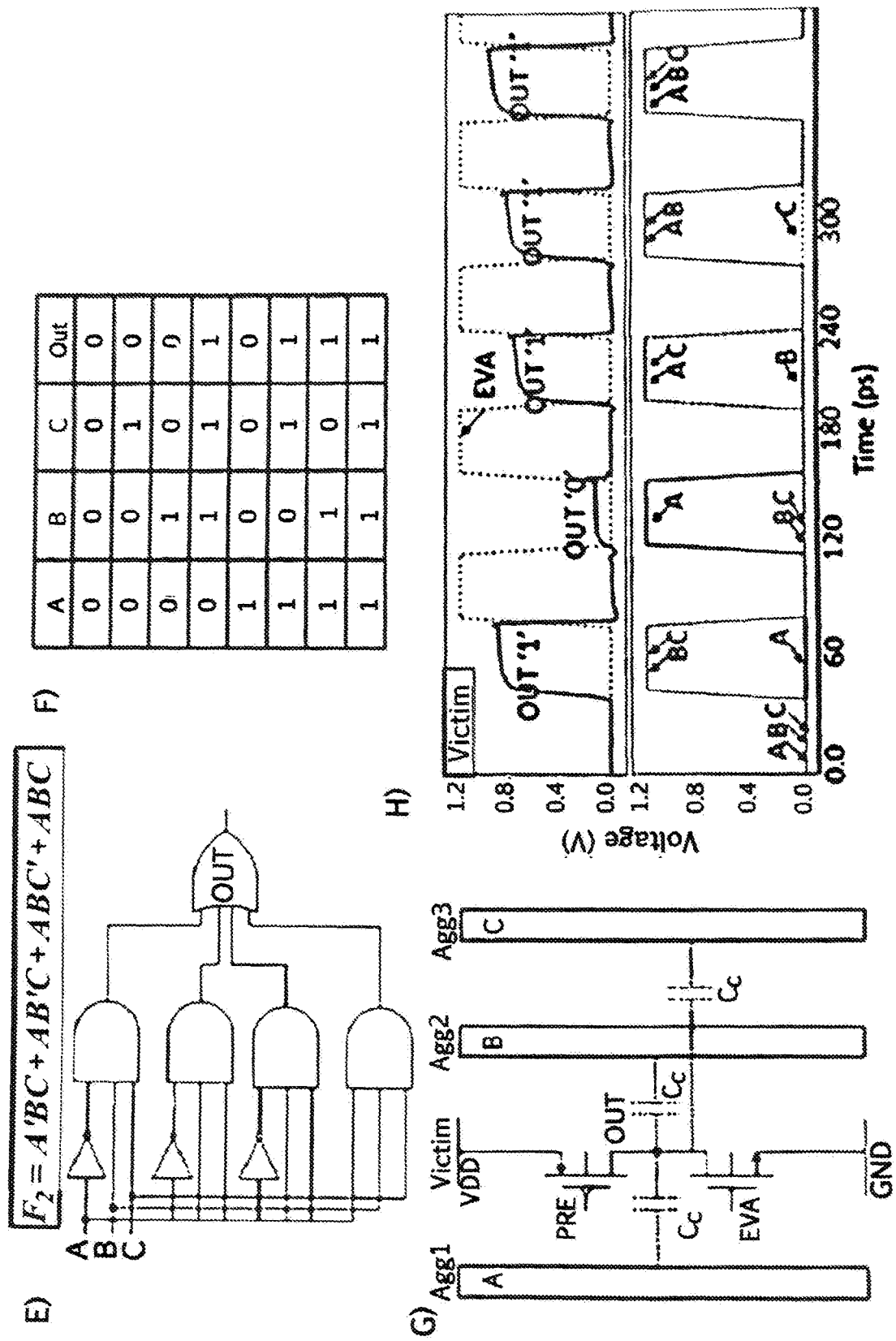

FIG. 3A shows traditional Boolean gate-based implementation of F1=AC+AB+BC. FIG. 3B shows a corresponding truth table. It is notable that the output is 1 when any combination of two inputs is high. By having homogenous coupling between A to OUT, B to OUT, and C to OUT, and by engineering the capacitance such that only when two or more inputs are high the OUT node goes high (acceptable voltage for logic 1, which is above 0.8V in this example), with the crosstalk approach the same logic may be implemented like an elementary gate and allowing reduction of transistor count from sixteen to just two (see FIGS. 3C-3D). The same concept applies for more complex logic such as F2=A'BC+AB'C+ABC'+ABC, when the output is high depending on any two high inputs (see FIGS. 3E-3F). The corresponding compressed crosstalk based implementation and HSPICE simulation results are shown in FIGS. 3G and 3H. In this case, the transistor count is reduced from thirty-eight to two.

This logic compression with homogenous coupling is generic and can be applied to any logical function that requires two or more inputs to be high in order to get the output as 1. The coupling strength is typically the same for all inputs to the output and depend on the logic being computed and will vary proportionally with higher fan-ins. If we consider unit coupling strength to be Cc between inputs and output for a two-input function, then it will be Cc/α, Cc/ß, and Cc/n, where α, ß, n are proportionality constants for three-inputs, four-inputs, and so on.

Crosstalk computing can also result in compact implementations for Boolean expressions which are biased towards a particular input. As opposed to the previous case where the output of a particular function goes high when any of the two or more inputs (considering fan-in>two) are high, there are functions whose output is biased towards one or more inputs and turns to 1 more when those inputs are 1. For example, for the function F1=ABC+A (B'+C), the output of F1 is more biased towards A as evident from the truth table in FIG. 4B. To implement this using proposed crosstalk principles, the coupling strength will be engineered to be higher for A to OUT than B to OUT and C to OUT (i.e., CA-OUT=Cc, CB-OUT=Cc/3, CC-OUT=Cc/3). Since this variation of coupling strength is dependent on the input bias towards output, we call these circuits weighted crosstalk circuits; the coupling strength will be weighted based on the bias. The benefits that can be attained with such circuits are potentially substantial. A traditional CMOS implementation of gate-based netlist of FIG. 4A would require twenty-two transistors, whereas the crosstalk implementation only requires two transistors (see FIG. 4C). The HSPICE simulation results in FIG. 4D reinforce this concept.

The same method of applying weighted coupling strength is applicable for more than three inputs as shown in FIG. 4G. For a logic function F2=B (D+C+A)+A(D+C), the output F2 is biased towards inputs A and B. Whenever A and B are 1, if another input (C or D) is 1 then F2 is 1; however, if C or D or both are 1 and A and B are both 0, then the output is 0 (FIGS. 4F & H). Because of this logic reduction, the transistor count reduces from CMOS's twenty-two to only two for crosstalk.

This logic compression approach with weighted strength is also generic. Any given logic expression may be decomposed to terms that require homogenous and heterogenous weights for crosstalk computation. To assign weight, the bias is first identified (in the F2 example, the bias is towards A and B) and then weighted coupling strength between those inputs and output is assigned (e.g., Cc for A to OUT and B to OUT). If the other inputs have equal weights in the logic being computed, then equal strength is assigned (e.g., Cc/α for D to OUT and C to OUT) that is a factor of the biased strength (Cc).

Figure 5A:
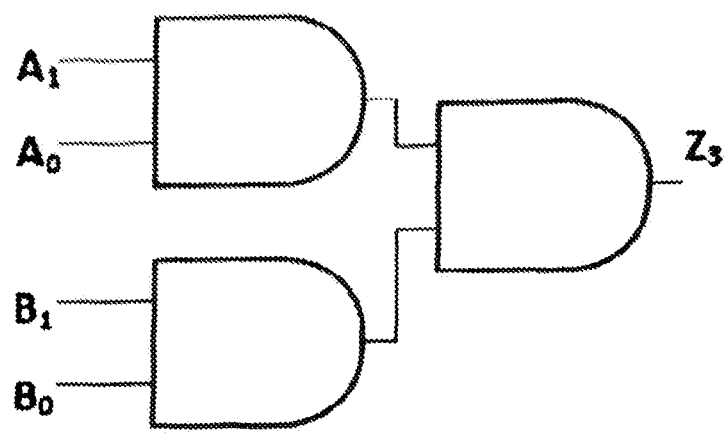
FIG. 5A is a drawing of a four input AND gate in CMOS and FIG. 5B is a drawing of an equivalent AND gate according to one embodiment of the present invention.
Figure 5B:
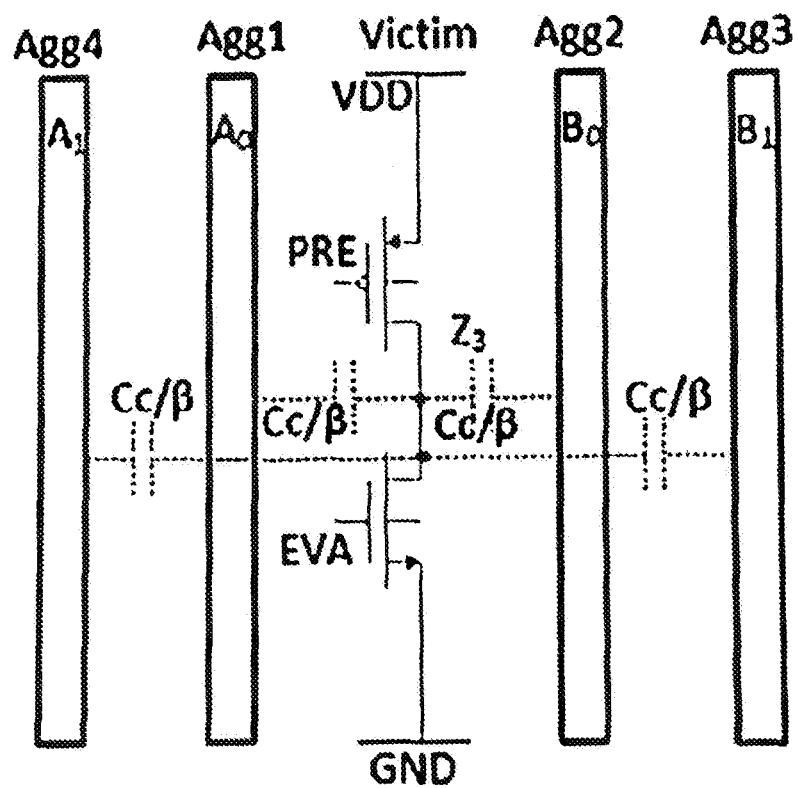

As is evident from the above discussion, crosstalk computing provides flexibilities for high fan-in calculations. The inputs can be coupled to the output with homogenous or heterogenous strength for a given logic without requiring intermediate logic stages. This is in contrast to CMOS, where with fan-in increase, transistor count increases linearly and as a result load resistance and capacitance increases also, which yields higher delay and power consumption. Since transistor switching is not required for crosstalk computing, CMOS like obstacles are not present and a higher number of inputs can be connected to output without detrimental effects. An example of 4-bit AND is shown in FIG. 5. A CMOS based implementation of the AND (see FIG. 5) would require two-level cascading and twelve transistors. The crosstalk implementation requires only two transistors and homogenous coupling strength between inputs and output.

For large-scale circuits, logic cascading and maintaining signal integrity is a challenge. In this regard, the crosstalk computing approach provides opportunities as well as challenges. Utilizing crosstalk, both fundamental logic gates (AND, NAND, XOR, OR, NOR) may be implemented along with a reduction of complex combinational logic blocks, such that any logic function can be implemented. The logic functions that require hierarchical implementation will be implemented by cascading outputs through coupling. An example is shown in FIG. 6, which implements function Z1=A1A0'B0+A1B1'B0+A1 'A0B1+A0B1B0', which is one of the outputs of a two-bit multiplier. In this implementation, AND gates are implemented first, and then outputs are cascaded through coupling to the next stage gate, which is an AND of all outputs. Here, crosstalk coupling provides opportunities to cascade efficiently. The logic reduction techniques discussed earlier can be utilized at hierarchical levels.

While cascading outputs at several levels, maintaining signal integrity becomes a challenge, since with each stage of coupling the induced voltage in the next level reduces compared to the previous. To solve this problem, buffers may be employed (back to back inverters) or transistors with different threshold voltages.

Figure 7:
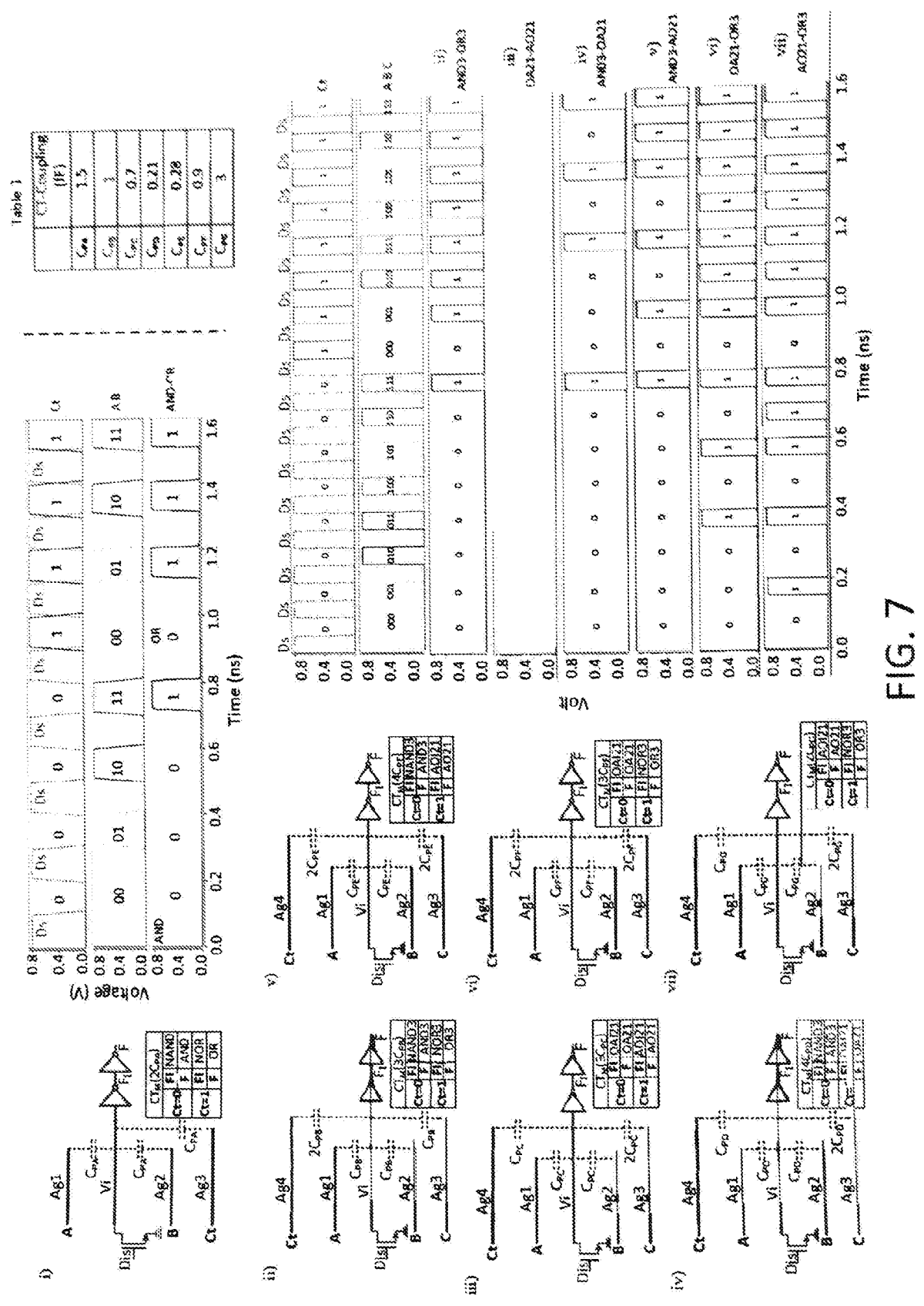

The polymorphic logic gates exhibit multiple logic behaviors by altering a control variable, as a result, increases the logic expressibility of a circuit. The CT-Polymorphic (CTP) gates switch the logic behavior by using an additional control aggressor. The reconfigurability is shown between following logics: homogeneous to homogeneous logic type (e.g., AND to OR); heterogeneous to heterogeneous logic type (e.g., AO21 to OA21); and homogeneous to heterogeneous logic type (AND to AO2, AND to OA21, OR to AO21, OR to OA21). FIG. 7 shows the CT-P AND-OR circuit and its response graph. As shown in the circuit diagram, inputs (A and B) and control aggressor (Ct) has the same coupling CPA (the coupling capacitance values are detailed in Table. 1). F1 stage gives inverting function (NAND/NOR) response and F stage gives noninverting function (AND/OR). The margin function for AND-OR cell is CTM (2CPA). When control Ct=0 it operates as AND, whereas, when Ct=1 the Ct aggressor (Ag3) augments charge through the coupling capacitance CPA, hence, following the function CTM (2CPA) the cell is now biased to operate as an OR gate, therefore, the transition of either A or B is now sufficient to flip the inverter. The same response can be observed in the simulation plots shown in the FIG. 7, the first panel shows the discharge (ds) and control (Ct) signals, 2nd panel shows the input combinations fed through A and B, and 3rd panel shows the response at stage F. It has been observed that the circuit responds as AND when Ct=0 for first four input combinations (00 to 11), whereas, it responds as OR when Ct=1 during next four input combinations (00 to 11).

FIG. 7 illustrates six circuits implementing 3 variable polymorphic functions. The input signals (A, B, C, Dis, and Ct) are shown common, while the responses of the circuits from FIG. 7 depict the 3 input AND-OR gate whose margin-function is CTM (3CPB), the three inputs (A, B, and C) are given CPB coupling, whereas, Ct aggressor is given twice the inputs, i.e., 2CPB. When control Ct=0 it operates as AND3, whereas, when Ct=1 the Ct aggressor (Ag4) augments charge through the coupling capacitance 2CPB, hence, following the function CTM (3CPB) the cell is now biased to operate as an OR3. The same response can be observed in the corresponding response graph (panel-3). The circuit responds as AND3 when Ct=0 for first eight input combinations (000 to 111), whereas, it responds as OR3 when Ct=1 during next eight combinations (000 to 111).

Next, the OA21-AO21 circuit is a heterogenous-to-heterogeneous polymorphism. Here, aggressors A, B, and Ct are given CPC coupling, whereas input C is given 2CPC, the margin function is CTM (3CPC). When control Ct=0 it operates as OA21, whereas, when Ct=1 the Ct aggressor (Ag4) augments charge through the coupling capacitance CPC, hence, following the function CTM (3CPC) the cell is now biased to operate as an AO21. The same response can be observed in the simulation graph (4th panel), the circuit responds as OA21 when Ct=0 for first eight input combinations (000 to 111), whereas, it responds as AO21 when Ct=1 for next eight combinations (000 to 111).

Next are four different heterogeneous to homogeneous polymorphic circuits. The AND3-OA21 circuit, where, A, B, and Ct are given CPD coupling, while input C is given 2CPD, the margin function now is CTM (4CPD). When control Ct=0 it operates as AND3, whereas, when Ct=1 the Ct aggressor (Ag4) augments charge through the coupling capacitance CPD, hence, following the function CTM (4CPD) the cell is now biased to operate as an OA21. The same response can be observed in the simulation graph (5th panel), the circuit responds as AND3 when Ct=0 for first eight input combination (000 to 111), whereas, it responds as OA21 when Ct=1 for next eight input combinations (000 to 111). Similarly, the AND3-AO21 circuit with A and B given CPE coupling, while Ct and C are now given 2CPE coupling, and the margin function here is CTM (4CPE), the circuits respond (6th panel) as AND3 for all input combinations when Ct=0, whereas, it responds as AO21 when Ct=1. Similarly are polymorphic OR3-OA21 and OR3-AO21 circuits respectively.

The coupling choices for A, B, C, and Ct are as depicted in the circuit diagrams. The margin functions are CTM (3CPF) and CTM (2CPG) for OR3-OA21 and OR3-AO21 respectively. The simulation graphs in panel-7 and panel-8 show the response of corresponding circuits for all input combinations. When Ct=0 for first 8 input combinations (000 to 111), the circuits 7*vi* and 7*vii* respond as OA21 and AO21 respectively, whereas, they both respond as OR3 when Ct=0 for next 8 input combinations (000 to 111). It is worth noticing that, in all the cases, the control aggressor augments the charge (when it transitions from 0 to 1) required to bias the circuit to an alternate operation.

Figure 8:
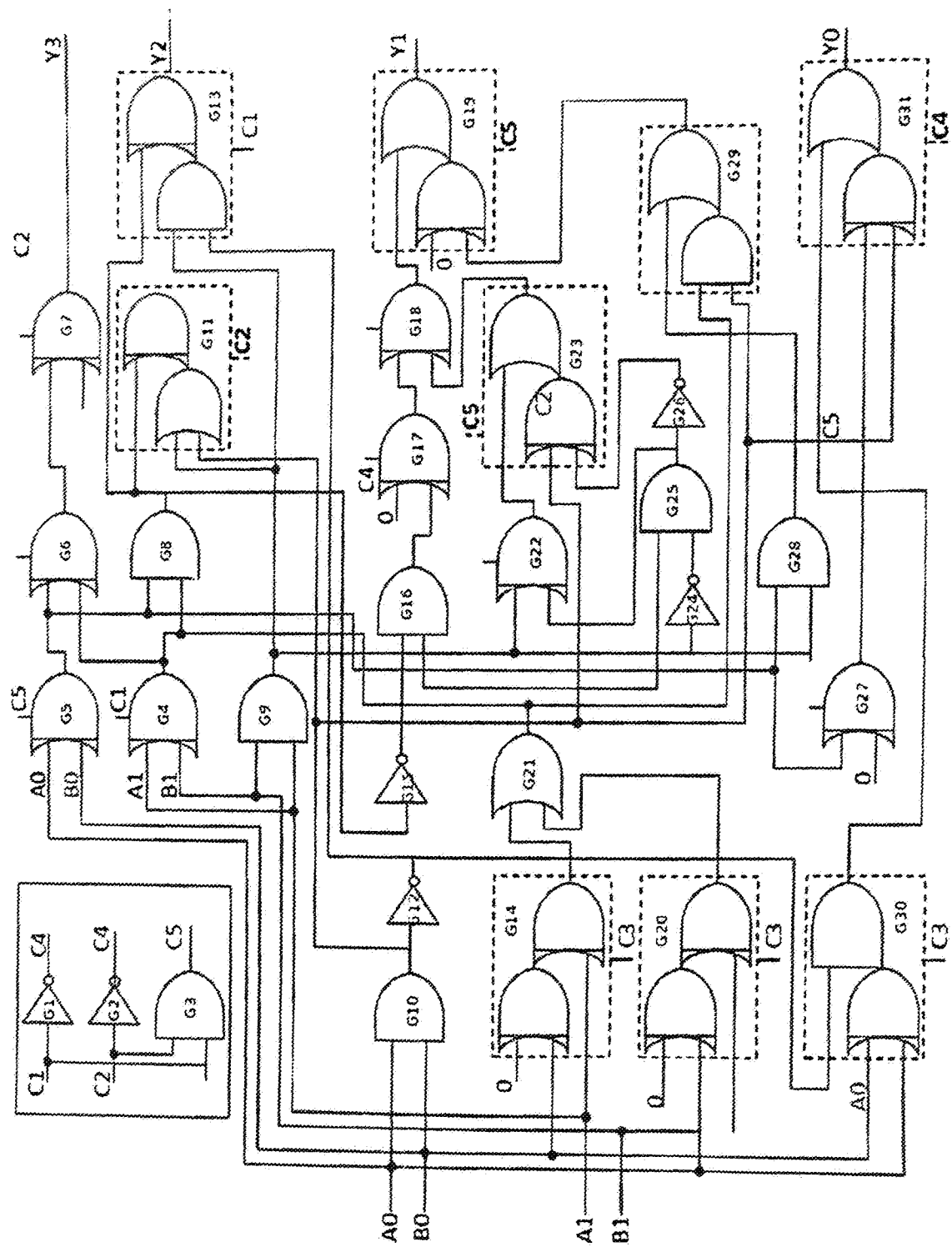
FIG. 8 is a drawing of a 2-bit multiplier-sorter according to another embodiment of the present invention.
Figure 9:
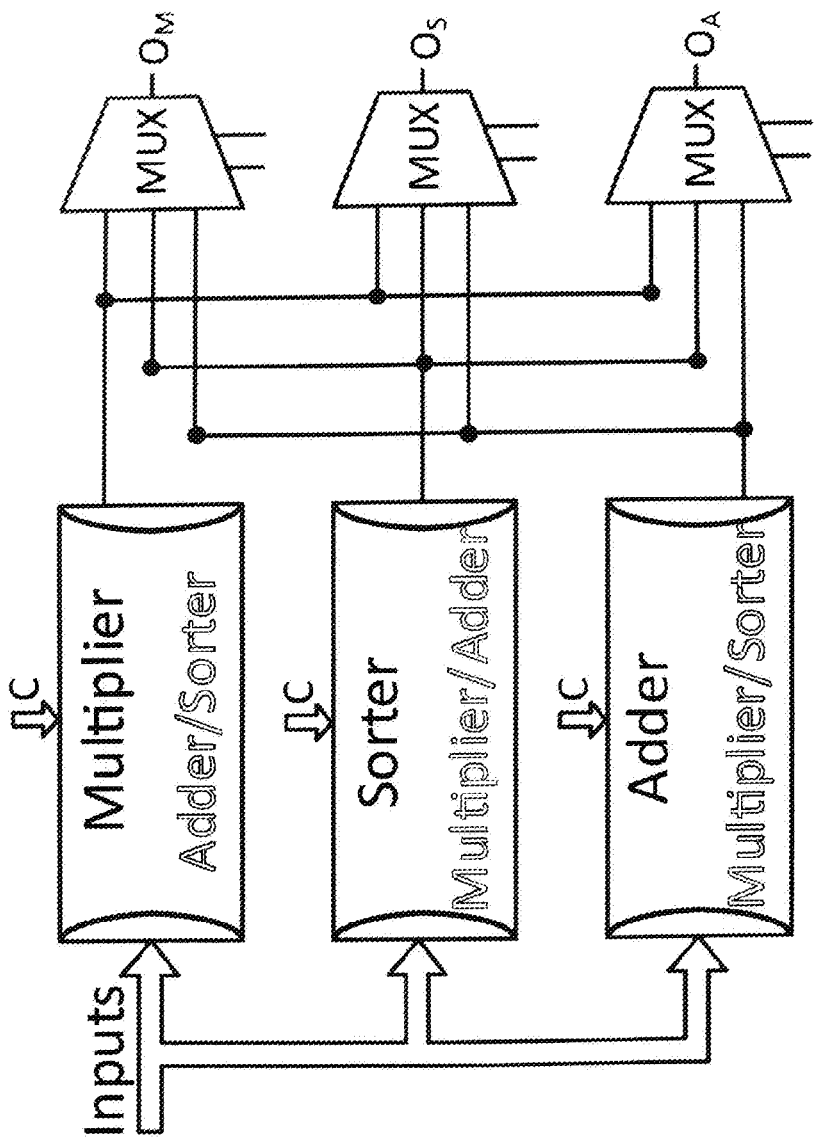
FIG. 9 is a schematic logic diagram of a simulation response according to the embodiment of FIG. 8.

To show the potential of CT polymorphic logic gates an example circuit of 2-bit multiplier-sorter (FIG. 8) is implemented using the above gates. The circuit uses 19 gates in total, 16 CT gates, and 3 inverters. 8 out of 16 CT gates are CT polymorphic gates. Polymorphic gates are efficiently employed to switch between the multiplier and sorter operations. A control signal (Ct) is used switch between this the operations, Ct=0 is a multiplier and Ct=1 is Sorter. FIG. 9 shows the simulation response of the circuit, different operation modes of the circuit are annotated on top, which are, Discharge State (DS), Multiplier (M) and Sorter (S). The first panel in the figure shows Dis and Ct signals, second and third panels show the two 2-bit inputs A[1:0] and B[1:0], the following panels show the 4-bit response of the circuit Y[3:0]. To depict multiplier and sorter operations effectively, the Ct signal is given as 0 and 1 alternately which makes the circuit operate as multiplier and Sorter in successive logic states. Also, common inputs A[1:0] and B[1:0] are given for adjacent M and S modes, it can be observed from the response graphs (Y[3:0]) that, for same inputs, the circuit gives multiplier result when Ct=0 and sorter result when Ct=1. For example, for the first input combinations, 10 and 11, the M operation gives 0110 as output and S operation gives 1110, similarly, for the second inputs, 01 and 01, M operation gives 0001 and S operation gives 1100. Similarly, M and S outputs are shown for few other combinations. The circuit consumes only 88 transistors. Thus CT-P circuits are compact, possess maximum reconfigurable features, and can efficiently implement larger polymorphic circuits in cascaded topology.

Figure 11A:
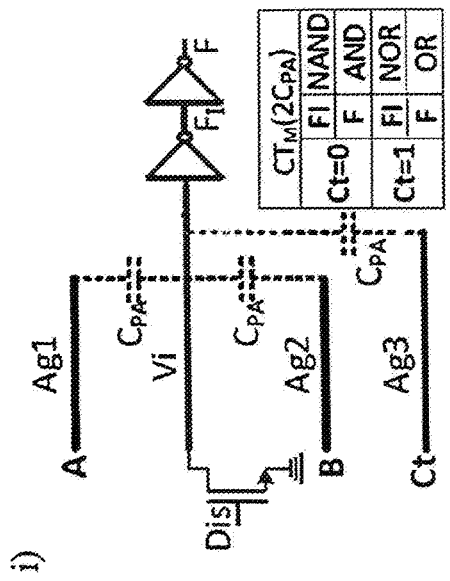
FIG. 11A is a circuit diagram of a polymorphic NAND/NOR gate according to an embodiment of the present invention.
Figure 11B:
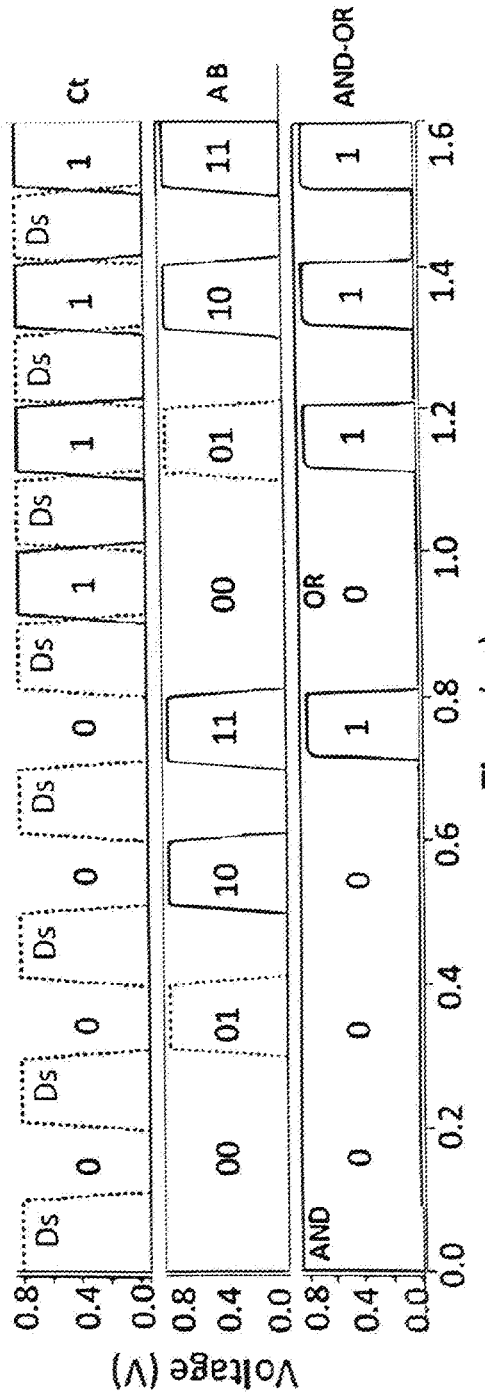
FIG. 11B shows a corresponding state graph of the circuitry of FIG. 11A.

Embodiments of the invention utilize basic gates constructed according to crosstalk logic, for example the circuits shown in FIGS. 10A and 10B. FIG. 10A shows a nanocircuit NAND logic gate utilizing crosstalk logic according to an embodiment of the present invention. Such a crosstalk NAND gate structure may be one of many within an array of nanocircuitry. Logic gate $CT_M(2C_{ND})$ comprises two inputs A and B which are coupled to aggressor metal conductive lines Ag1 and AG2, respectively, which are both disposed proximate victim line Vi. Input lines A and B are coupled by two Capacitors $C_{ND}$ which have capacitance variables that are tuned and balanced to induce a signal on the victim line Vi. The victim line starts as the source of transistor Dis, which also has an drain coupled to ground, and Vi serves as an output node that is coupled to an inverter F. Aggressor conductive lines Ag1 and Ag2 are positioned to induce a signal on the victim Vi line. Similarly, FIG. 11B shows a nanocircuit NOR logic gate utilizing crosstalk logic according to an embodiment of the present invention. Such a crosstalk NAND gate structure may be one of many within an array of nanocircuitry. Logic gate $CT_M(2C_{NR})$ comprises two inputs A and B which are coupled to aggressor metal conductive lines Ag1 and Ag2, respectively, which are both disposed proximate victim line Vi. Input lines A and B are coupled by two Capacitors $C_{NR}$ which have capacitance variables that are tuned and balanced to induce a signal on the victim line Vi. The victim line starts as the source of transistor Dis, which also has an drain coupled to ground, and Vi serves as an output node that is coupled to an inverter F. Aggressor conductive lines Ag1 and Ag2 are positioned to induce a signal on the victim Vi line. FIG. 11C shows a graph of voltage versus time for both of the circuits of FIGS. 11A and 11B showing the charge summation from the states of input lines A and B on each of the circuits. Thus the simple structures of FIGS. 10A and 10B may be the building blocks of much more complex circuitry where, in contrast to traditional switch based logic, using summation based logic to significantly reduce the components. In addition to the above noted NAND and NOR logic circuits, AND and OR logic circuits may be similarly implemented according to the present invention. More complex logic circuits may be developed in other embodiments of the invention with crosstalk summation based logic, OR gate logic is stronger than AND gate logic, and using an inverter at the output node of the logic circuit reconstructs the output signal to full-swing—thus providing good noise margins while significantly reducing component requirements.

A further embodiment of the invention, the polymorphic NAND/NOR logic gate $CT_M(2C_{PA})$ is shown in FIG. 11A. The nanocircuit logic gate of FIG. 11A may be disposed within an array of nanocircuitry, and comprises inputs A and B along aggressor metal conductive lines Ag1 and Ag2, respectively, and control input Ct along aggressor metal conductive line Ag3. Victim line Vi extends from the source of transistor Dis to the input of inverter $F_I$, the output of inverter $F_I$ being the input to inverter F that serves as the output of the logic gate circuit. The aggressor and control conductive lines are positioned to induce a signal on the victim line. At least one capacitor $C_{PA}$ electrically couples the aggressor metal conductive lines and are positioned inductively proximate the victim line. The capacitor is tuned to induce a logic level voltage on the victim line. Optionally, a second capacitor $C_{PA}$ is coupled between the aggressor lines, both capacitors $C_{PA}$ balanced to induce the logic level on the victim line. At least one capacitor is located inductively proximate to the input of the inverter. Further, another capacitor $C_{PA}$ couples the control aggressor line to the victim line. The victim line is input to the inverter, and the inverter output is the logic gate output, with the victim line including the source of transistor Dis which has its drain coupled to ground. Further embodiments of the invention, for example those shown in several of the circuits in FIG. 7, a second control aggressor metal line is coupled to the victim line, optionally with a further capacitor, optionally balanced with the other control aggressor metal line capacitor.

A further embodiment of the invention, FIG. 12 shows the usage of polymorphic cells as complex logic functions. Inverting and non-inverting functions require only 3 and 5 transistors respectively. The crosstalk polymorphic logic gates used in performing the complex functions require fewer transistors and less power. Crosstalk polymorphic logic gates are uniform, modular and generic in structure, and thus scalable to larger polymorphic digital systems.

While the novel technology has been illustrated and described in detail in the drawings and foregoing description, the same is to be considered as illustrative and not restrictive in character. It is understood that the embodiments have been shown and described in the foregoing specification in satisfaction of the best mode and enablement requirements. It is understood that one of ordinary skill in the art could readily make a nigh-infinite number of insubstantial changes and modifications to the above-described embodiments and that it would be impractical to attempt to describe all such embodiment variations in the present specification. Accordingly, it is understood that all changes and modifications that come within the spirit of the novel technology are desired to be protected.

We claim:

1. A nanocircuit logic gate within an array of nanocircuitry, the logic gate comprising:
    a first and second aggressor metal conductive lines;

a victim line;
an inverter coupled to the victim line; and
a first transistor having a source side coupled to the victim line;
a second transistor having a drain side coupled to the victim line and a source side coupled to ground;
wherein the first and second aggressor metal conductive lines are positioned to induce a signal on the victim line; and
wherein the first and second transistors synchronize the victim line with the array of nanocircuitry.

2. The nanocircuit logic gate of claim 1 wherein the at least one capacitor is tuned to induce a Boolean logic state voltage on the victim line.

3. The nanocircuit logic gate of claim 2 further comprising a second capacitor coupled between the first and second aggressor metal conductive lines, the second capacitor balanced with the at least one capacitor.

4. The nanocircuit logic gate of claim 1 further comprising a second capacitor coupled between the first and second aggressor metal conductive lines, the second capacitor balanced with the at least one capacitor.

5. The nanocircuit logic gate of claim 1 wherein the victim line is input to the inverter, and the inverter output is a Boolean logic gate output.

6. The nanocircuit logic gate within an array of nanocircuitry of claim 1 wherein when one of the respective first and second transistors is turned on, output from the victim line is kept floating.

7. The nanocircuit logic gate within an array of nanocircuitry of claim 1 wherein the transistors may be energized to make the victim line operate as a gate selected from the group comprising an AND gate, an OR gate, and an XOR gate.

8. The nanocircuit logic gate within an array of nanocircuitry of claim 1 wherein the first transistor is gated with a first clock signal and the second transistor is gated with a second, different clock signal.

9. The nanocircuit logic gate within an array of nanocircuitry of claim 1 wherein the respective aggressor metal conductive lines are uniformly coupled to the victim line.

10. A configurable nanocircuit logic gate within an array of nanocircuitry, the logic gate comprising:
a first and second aggressor metal conductive lines;
a control aggressor metal conductive line;
a victim line;
a first inverter coupled to the victim line;
a first transistor having a first terminal coupled with the victim line; and
a second transistor having a second terminal coupled with the victim line;
wherein the first and second aggressor metal conductive lines and the control aggressor metal conductive line are positioned to induce a signal on the victim line; and
wherein the victim line may be controlled to operate as respective AND, OR, NAND, and NOR gates.

11. The configurable nanocircuit logic gate of claim 10 further including at least one capacitor electrically coupling the first and second aggressor metal conductive lines and positioned inductively proximate the victim line.

12. The configurable nanocircuit logic gate of claim 11 wherein the at least one capacitor is tuned to induce a logic level voltage on the victim line.

13. The configurable nanocircuit logic gate of claim 12 further comprising a second capacitor coupled between the first and second aggressor metal conductive lines, the second capacitor balanced with the at least one capacitor.

14. The configurable nanocircuit logic gate of claim 11 wherein the at least one capacitor is located inductively proximate to the first input of the inverter.

15. The configurable nanocircuit logic gate of claim 14 further comprising a second capacitor coupled between the first and second aggressor metal conductive lines, the second capacitor balanced with the at least one capacitor.

16. The configurable nanocircuit logic gate of claim 10 further comprising at least one capacitor coupling the control aggressor metal conductive line to the victim line.

17. The configurable nanocircuit logic gate of claim 16 wherein the at least one capacitor is tuned to induce a logic level on the victim line.

18. The configurable nanocircuit logic gate of claim 10 wherein the victim line is input to the first inverter, and the first inverter output is the logic gate output.

19. The configurable nanocircuit logic gate of claim 10 further comprising a second inverter coupled to an output of the first inverter.

20. The configurable nanocircuit logic gate of claim 10 further comprising a second control aggressor metal line coupled to the victim line.

* * * * *